(12) United States Patent
Liaw

(10) Patent No.: US 7,679,947 B2
(45) Date of Patent: Mar. 16, 2010

(54) SEMICONDUCTOR DEVICES WITH SOURCE AND BULK COUPLED TO SEPARATE VOLTAGE SUPPLIES

(75) Inventor: Jhon-Jhy Liaw, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/498,363

(22) Filed: Aug. 2, 2006

(65) Prior Publication Data

US 2008/0031045 A1    Feb. 7, 2008

(51) Int. Cl.
    *G11C 11/00*    (2006.01)
(52) U.S. Cl. .................... 365/154; 365/51; 365/63; 365/226; 365/227
(58) Field of Classification Search ............... 365/51 X, 365/63 X, 154 O, 226 X, 227 X, 51, 63, 154, 365/226, 227; 257/E21.661, E27.098
See application file for complete search history.

(56) References Cited

U.S. PATENT DOCUMENTS

| | | | | |
|---|---|---|---|---|
| 6,574,161 B2 * | 6/2003 | Ooishi | ........................ | 365/182 |
| 6,862,227 B2 * | 3/2005 | Yamaoka et al. | ....... | 365/189.09 |
| 7,200,030 B2 * | 4/2007 | Yamaoka et al. | ............ | 365/154 |

OTHER PUBLICATIONS

K. Zhang, et al., "A 3-GHz 70Mb SRAM in 65nm CMOS Technology with Integrated Column-Based Dynamic Power Supply", ISSCC 2005, Session 26, Non-Volatile Memory, 26.1, pp. 474-475, 611.

* cited by examiner

*Primary Examiner*—VanThu Nguyen
(74) *Attorney, Agent, or Firm*—K & L Gates LLP

(57) ABSTRACT

A semiconductor transistor array is disclosed having a plurality of identical transistors, with sources of the transistors commonly coupled to a first voltage supply, and bulks of the transistors commonly coupled to a second voltage supply which is different from the first voltage supply, wherein different voltages can be supplied to the sources and bulks.

18 Claims, 5 Drawing Sheets

SEMICONDUCTOR DEVICES WITH SOURCE AND BULK COUPLED TO SEPARATE VOLTAGE SUPPLIES

BACKGROUND

The present invention relates generally to semiconductor memory devices, and, more particularly, to static random access memory (SRAM) cell array structures.

SRAM has been a memory staple for a long time, due to its simple operation, high access speed and low power dissipation, etc. SRAM's simple operation comes from its bi-stable cells, meaning it can maintain its state indefinitely without refreshing as needed by dynamic random access memory (DRAM), as long as an adequate power is supplied.

One well-known conventional structure of a SRAM cell has six transistors (6T) that are constructed as a pair of pass-gate transistors and two cross-coupled inverters. Here the 'cross-coupled' means one inverter's output connected to the other inverter's input, so they form a latch circuit with bi-stable states. Each inverter comprises a NMOS pull-down transistor and a PMOS pull-up transistor. Conventionally, sources and bulks of the pull-up transistors are coupled to a positive power supply, or Vdd. Sources and bulks of the pull-down transistors as well as bulks of the pass-gate transistors are connected to ground, or Vss. The inverter's outputs serve as two storage nodes, when one is pulled low, the other is pulled high. A complementary bit-line pair is coupled to the pair of storage nodes via the pair of pass-gate transistors, respectively. The gates of the pass-gate transistors are commonly connected to a word-line. When the word-line voltage is switched to Vdd, the pass-gate transistors are turned on, so the storage nodes are accessible by the bit-line pair. When the word-line voltage is switched to Vss, the pass-gate transistors are turned off, so the storage nodes are essentially isolated from the bit lines, although some leakage occurs. But as long as the Vdd is maintained above a certain level, the state of the storage nodes is maintained indefinitely.

But with scaling of MOSFET dimensions deep down into deep submicron range, many new factors begin to seriously affect memory chip performance. For one thing, a system voltage that is lower than 1.0V is too close to transistor threshold voltage (Vt). Another factor is random dopant and device size fluctuations. All these factors impact particularly static noise margin (SNM) in SRAM, which causes loss in yield.

Smaller device size and lower power dissipation require the lowering of the system voltage. But SRAM accessing speed, stability and reliability require an adequate voltage. They are contradictory goals, and limit traditional SRAM's performances.

What is desired is an improved design to achieve substantial read/write noise margin through varying pull-up transistor voltage supply. By de-coupling source and bulk, the voltage supply to the sources can swing more easily.

SUMMARY

In view of the foregoing, this invention discloses a semiconductor transistor array having a plurality of identical transistors, with sources of the transistors commonly coupled to a first voltage supply, and bulks of the transistors commonly coupled to a second voltage supply which is different from the first voltage supply, wherein different voltages can be supplied to the sources and bulks.

The construction and method of operation of the invention, however, together with additional objects and advantages thereof will be best understood from the following description of specific embodiments when read in connection with the accompanying drawings.

DESCRIPTION

Figure 1:
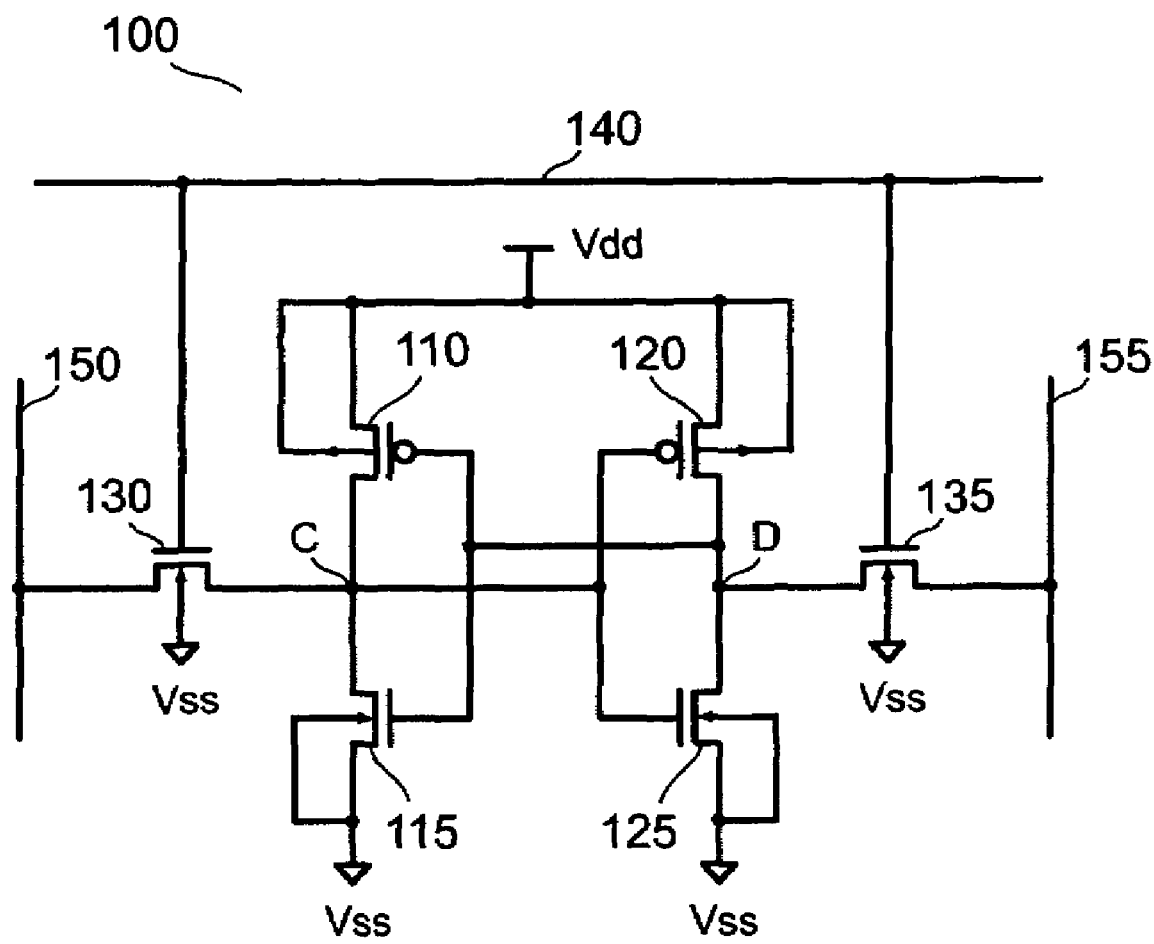
FIG. 1 is a schematic diagram showing a traditional 6T SRAM cell.

FIG. 1 is a schematic diagram illustrating a traditional six transistor (6T) SRAM cell 100. A PMOS pull-up transistor 110 and a NMOS pull-down transistor 115 are connected as a first inverter between a positive voltage supply, Vdd, and a ground, Vss. Another PMOS transistor 120 and NMOS transistor 125 are connected as a second inverter just like the first one. Then the inverters are cross-couple connected, i.e., an output of the first inverter is connected to an input of the second inverter, and an input of the first inverter is connected to an output of the second inverter, so they form a latch with bi-stable states to serve as a memory element. Nodes C and D are two storage nodes.

Referring to FIG. 1, when node C is in high voltage, the PMOS pull-up transistor 120 is off, and the NMOS pull-down transistor 125 is on, which pulls the node D toward Vss. With node D in low voltage, the NMOS pull-down transistor 115 is off, and the PMOS pull-up transistor 110 is on, which pulls up the node C voltage further higher toward Vdd. So the latch is a positive feed-back circuit, and will eventually reach a stable state, where node C voltage is Vdd and node D voltage is Vss. Since the circuits for node C and D are mirrored, so another state, where node C voltage is Vss and node D voltage is Vdd, is also stable. These bi-stable states can be maintained indefinitely as long as Vdd and Vss are maintained and the nodes C and D are isolated from outside circuits.

Two NMOS transistors 130 and 135 serve as pass gates for the storage nodes C and D, respectively. The gates of the both NMOS pass-gate transistors 130 and 135 are commonly connected to a word-line 140, which turns the NMOS pass-gate transistor 130 and 135 on or off by switching its voltage to Vdd or Vss, respectively. When the NMOS pass-gate transistors 130 and 135 are on, the voltages of the storage nodes C and D can be read into a pair of bit-lines 150 and 155, or complimentary driving voltages on the bit-line pairs 150 and 155 can be written into the storage nodes, i.e., bit-line 150 voltage overwrites node C voltage, and bit-line 155 voltage overwrites node D voltage. When the cell is not selected, both the bit-lines 150 and 155 are held at Vdd.

Figure 2:
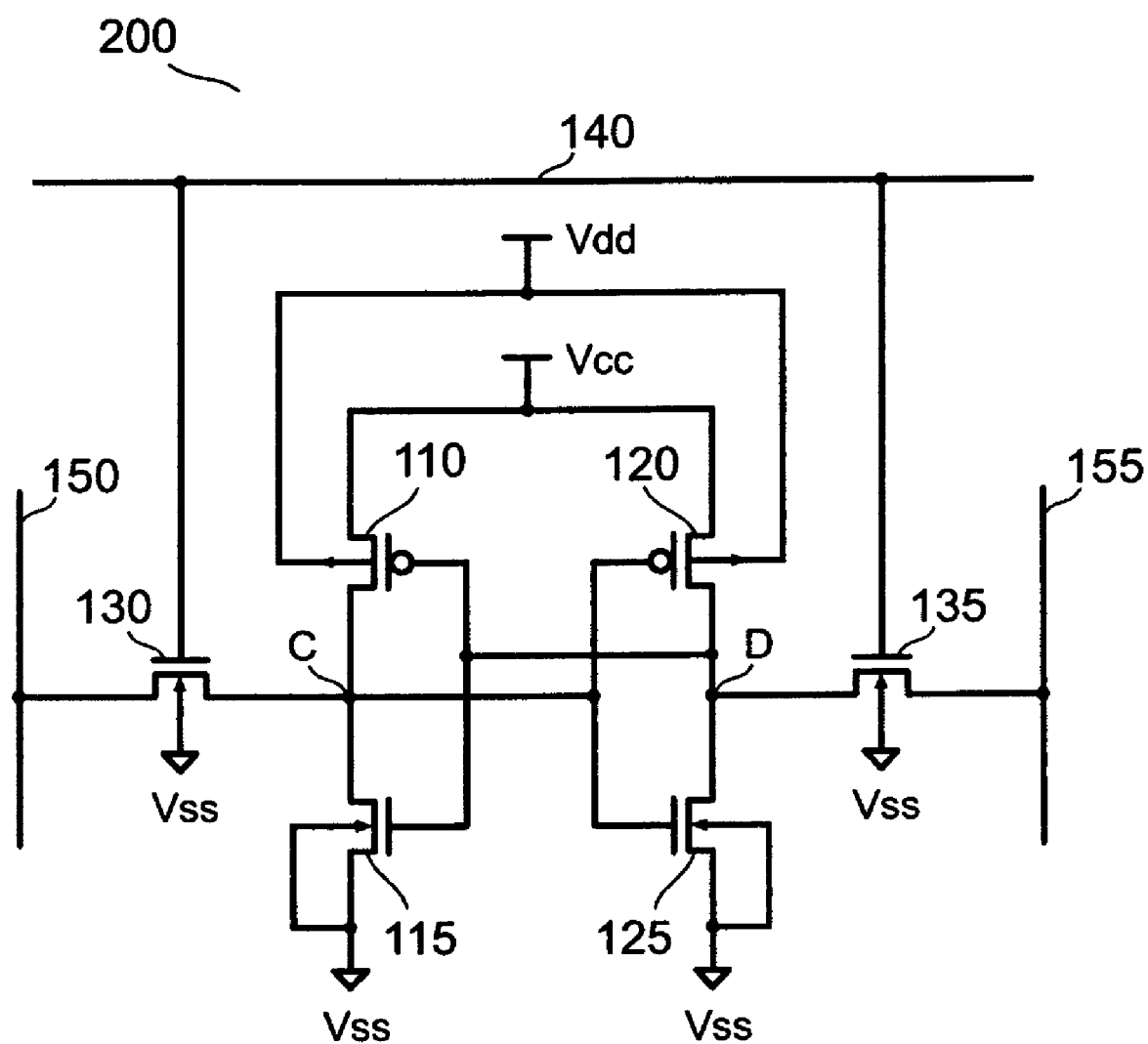
FIG. 2 is a schematic diagram illustrating a source of a SRAM cell connected to Vcc according to one embodiment of the present invention.

FIG. 2 is a schematic diagram showing a SRAM cell 200, identical to the traditional 6T SRAM cell as shown in FIG. 1, except that power connections are modified according to one embodiment of the present invention. Here sources of the PMOS pull-up transistors 110 and 120 are coupled to a positive voltage supply, Vcc, which is separated from Vdd. While bulks of the PMOS pull-up transistors 110 and 120 remain coupled to Vdd.

Figure 3:
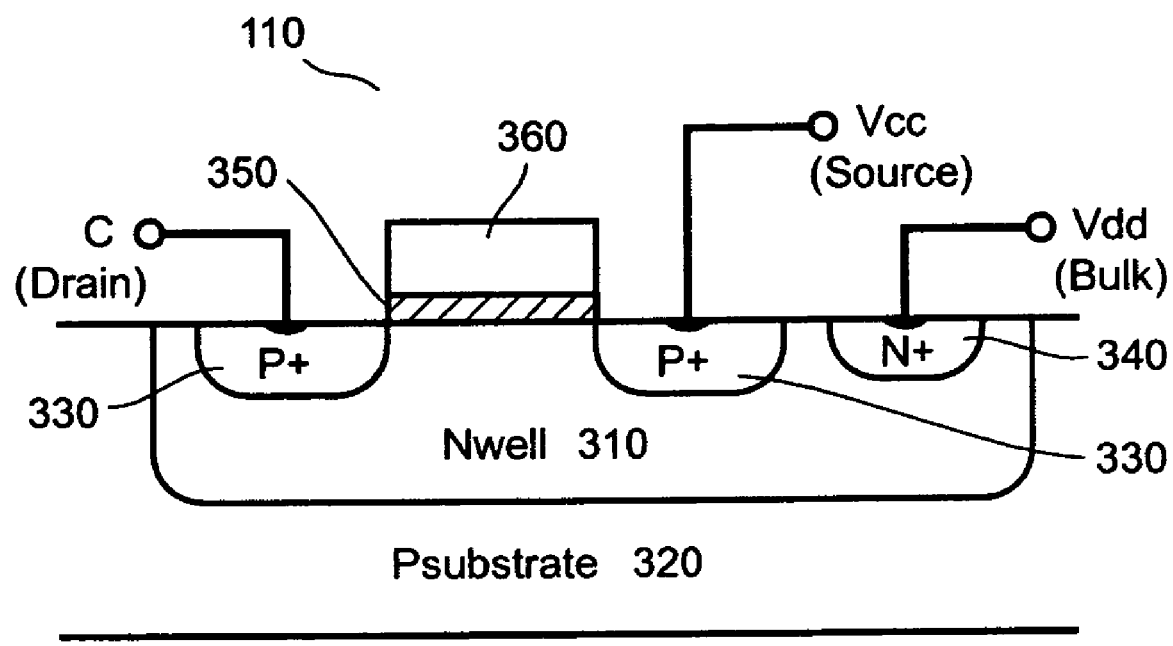
FIG. 3 is a cross sectional view of a PMOS pull-up transistor.

FIG. 3 is a cross sectional view of the PMOS pull-up transistor 110, which is identical to the PMOS pull-up transistor 120. As one embodiment of the present invention, the PMOS pull-up transistor 110 is formed inside a Nwell 310 which in turn resides in a Psubstrate 320. P+ regions 330 form device source and drain. One of the P+ regions 330 is connected to Vcc, and becomes a source. A contact to the Nwell 310 is made by a N+ region 340. Nwell 310 is a bulk of the PMOS pull-up transistor 110 and is connected to Vdd, which is separated from Vcc. According to one embodiment of the present invention, Vdd is kept at a constant positive voltage, while Vcc can vary dynamically in read, write and not-selected (not being addressed) operations. Making Vcc different from Vdd is to provide wider read/write noise margins to the SRAM cell 200.

TABLE 1 and TABLE 2 below summarize SRAM operation conditions according to the present invention.

TABLE 1

SRAM read cycle operation conditions

Selected block

| Read cycle | Selected Cell | Cells on the activated WL | Cells on the activated BL | Not-selected blocks |
|---|---|---|---|---|
| Vcc | Vdd + Vz | Vdd + Vz | Vdd or Vdd − Vy | Vdd or Vdd − Vy |
| V_Word-line | Vdd | Vdd | Vss | Vss |
| V_Bit-lines | Sensing | =< Vdd | floating | =< Vdd |

TABLE 2

SRAM write cycle operation conditions

Selected block

| Write cycle | Selected cell | Cells on the activated WL | Cells on the activated BL | Not-selected blocks |
|---|---|---|---|---|
| Vcc | Vdd or Vdd − Va | Vdd + Vz | Vdd or Vdd − Va | Vdd or Vdd − Vy |
| V_Word-line | Vdd or Vdd + Vb | Vdd or Vdd + Vb | Vss | Vss |
| V_Bit-lines | Vdd or Vdd + Vb (complimentary) | =< Vdd | Vdd, or, floating, or Vdd + Vb (complimentary) | =< Vdd |

Here the term 'block' refers to a smallest cell array unit, wherein all the cells in a row are connected to a single word-line (WL) and all the cells in a column are connected to a single pair of bit-lines (BLs). Customarily any sizable SRAM (bigger than a few hundred kilo bits) is divided into multiple blocks to gain speed and lower power consumption. In some bigger size SRAM (for instance, larger than a mega bits), the memory may be divided first into multiple sections independent from each other, and then within each sections there are multiple blocks. But in both cases, a certain address may select only one block either within a whole memory or within a section of the memory. Within the selected block there are only one word-line and one bit-line per bit (normally nine bits for a block) that are activated. A cell is activated only if both its word-line and bit-line pair are selected, so that there is only one cell at the cross point of the activated word-line and bit-line is a selected cell. Other cells on the activated word-line are not selected, and so are other cells on the same activated bit-line pair.

Referring to TABLES 1 and 2, voltages Vb, Vz, Vy and Va are empirically set at 3% to 30% of Vdd. Main reasons for putting a cap on the voltage increases (around 30%) are, (1) putting source and bulk at different voltages essentially back biases a transistor, and too big a bias may cause the transistor's threshold voltage drop so that the transistor is in always on state, that will cause malfunction of the SRAM cell; and (2) modern thin gate oxide cannot sustain very high voltage. But exact amounts of voltage increases depend on particular manufacturing technologies as well as design considerations.

Referring to TABLE 1 (read cycle operation conditions), and FIG. 2, and assume node C is high voltage (Vdd) and node D is low voltage (Vss) prior to read, cell 200 is a selected cell, its Vcc=Vdd+Vz, then node C will be pulled up, higher than Vdd. The higher node C voltage will turn on the pull-down transistor further, i.e., providing more source-drain current, so that it can pull-down the bit-line 155 voltage more forcefully. In order to read out the memory cell state, a sense amplifier (not shown) coupled to the bit-line pair 150 and 155, senses the voltage difference between them. The bigger the voltage difference the higher the sensing or read margin. More forcefully pulling down the bit-line 155 can also help read speed by allowing the sense amplifier to start sensing earlier.

Referring to TABLE 1, Vcc for those not-selected cells remains at Vdd or drops to Vdd-Vy. Dropping Vcc helps to lower memory cell power consumption.

Referring to TABLE 2 (write cycle operation conditions) and FIG. 2, Vcc is lowered to Vdd−Va to allow easier writing. Writing is essentially a pull-down transistor in a bit-line driver (not shown) fighting with the pull-up transistor 110 or 120 in the memory cell 200, so that a weaker pull-up transistor makes writing easier. On the other hand, if a bit-line driving voltage (V_Bit-line) as well as word-line voltage (V_Word-line) which passes the bit-line voltage, for a selected cell are raised to Vdd+Vb, the bit-line pull-down becomes more forceful, which also makes writing faster.

Vcc for not-selected cells in the same selected block is boosted higher (Vcc+Vz) to better prevent the cells from being disturbed. Vcc in not selected blocks either remains at Vdd or drops to Vdd−Vy. Dropping Vcc helps to lower memory cell power consumption.

As aforementioned varying Vcc can improve noise margins as well as speed of read/write operations, but if Vcc is coupled with a huge capacitor which slows down voltage swings, then the varying Vcc scheme is not practical for modern high density and high speed SRAM. So at the heart of the present invention is the separation of the power connections to the source and bulk of the pull-up transistors 110 and 120 as shown in FIG. 2, hence Vcc see only the source capacitance, instead of both source and bulk capacitances as in traditional cell array structure shown in FIG. 1.

Figure 4:
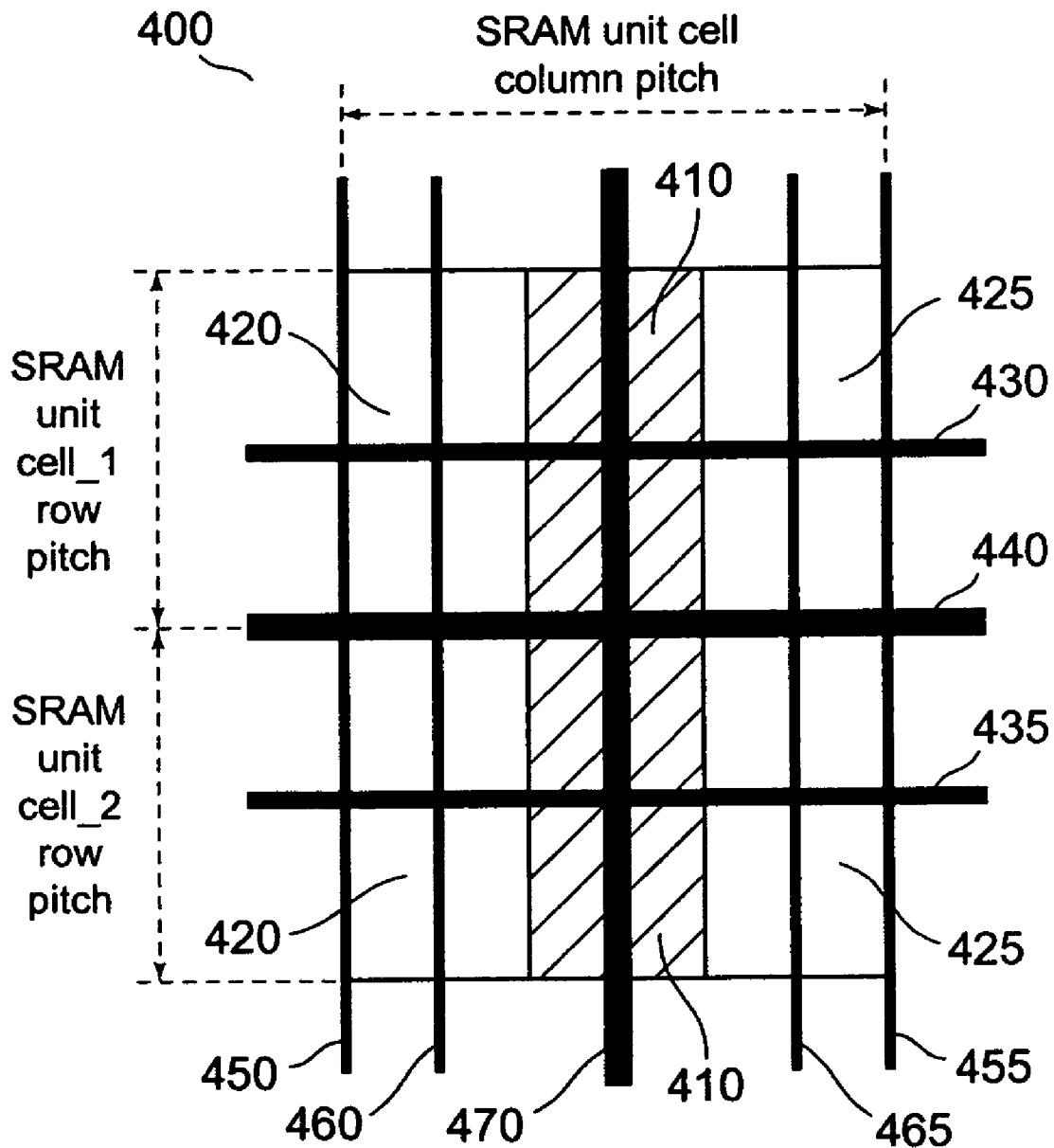
FIG. 4 is a layout diagram illustrating layout arrangements of power conductors.

FIG. 4 is an exemplary cell layout arrangement 400 for implementing the separation of the source and bulk power connections. Two SRAM unit cells are placed next to each other in a column direction. PMOS pull-up transistors are formed inside a Nwell 410 in the middle section. NMOS pass-gate transistors and pull-down transistors are formed inside two Pwells 420 and 425 which flank the Nwell 410. Word-line conductors 430 and 435 go horizontally, they can be formed either by metal or polysilicon. Nwell conductor 440 which supplies Vdd to both cells also goes horizontally, and is normally formed by metal. The substantially horizontal word-line conductors 430 and 435 and the Nwell conductors 440 may be formed by one metal layer. Vss conductors 450 and 455, bit-line conductors 460 and 465 and PMOS source/drain Vcc conductor 470 are substantially vertically placed, and they may be formed by a metal layer other than the one for the Nwell conductor 440, so that they do not interfere with each other, i.e., Vcc and Vss can have different voltage supply source.

Figure 5:
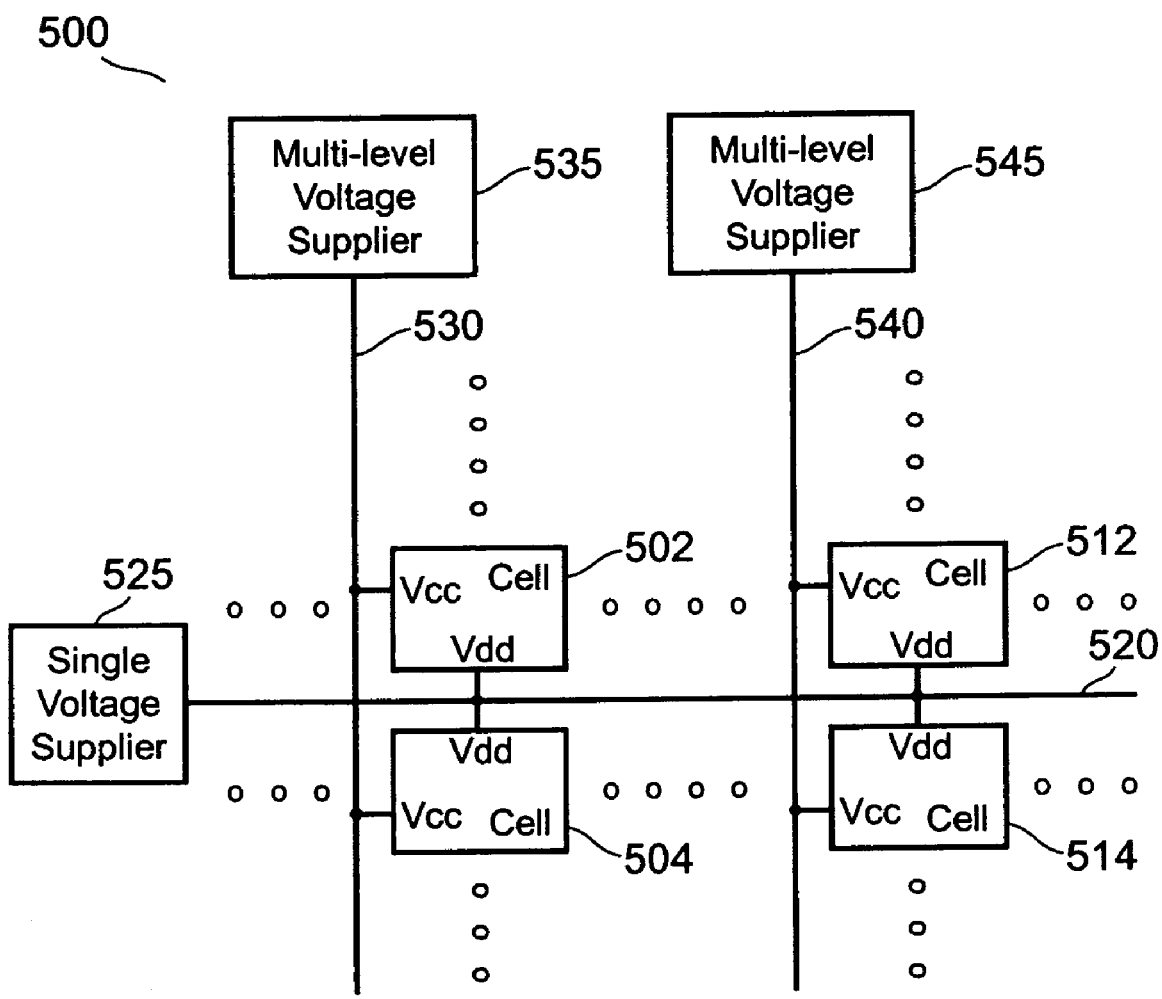
FIG. 5 is a schematic diagram illustrating a memory array supplied by separated voltage suppliers.

FIG. 5 is a schematic diagram illustrating a memory array 500 supplied by separated voltage suppliers. The memory array 500 is built on the knowledge discussed earlier that supplying different voltages for read or write operation can boost memory cell performance. Besides, separate PMOS source and Nwell bulk with will make it easier to swing PMOS source voltage, due to reduced capacitance. Referring to FIG. 5, four exemplary memory cells in a same memory block, 502, 512, 504 and 514 have separated Vcc and Vdd, where Vcc is PMOS source voltage supply, and Vdd is PMOS Nwell bulk voltage supply. The Nwell bulk voltage, Vdd, does not change throughout the various operations, while the source voltage, Vcc, changes for different operations. So a Vdd line 520 is connected to a single voltage supplier 525, and Vcc lines 530 and 540 are connected to multi-level voltage suppliers 535 and 545, respectively. The multi-level voltage suppliers 535 and 545 are separated, so that individual Vcc lines can have different voltages, as read or write operation only happens to a few columns of cells, the rest columns of the memory block are inactive, and hence their Vcc lines are not swung. Swinging only a single Vcc line further reduces its capacitance. Here a memory block refers to a small memory array, wherein all the rows and columns are related by both row address decoders and column address decoders. For instance, in a block with 256 rows and 16 columns, all the rows share the same 8-to-256 binary decoder, and all the columns share the same 4-to 16 binary decoder.

This invention provides many different embodiments, or examples, for implementing different features of the invention. Specific examples of components and methods are described to help clarify the disclosure. These are, of course, merely examples and are not intended to limit the disclosure from that described in the claims.

What is claimed is:

1. A semiconductor transistor array having a plurality of identical transistors in a first column, the transistor array comprising:
    a first transistor in the first column having a first source and a first bulk;
    a second transistor in the first column having a second source and a second bulk; and
    a third transistor in a second column having a third source and a third bulk, wherein the third source is coupled to a third voltage supply line that is different from the first or second voltage supply lines, and the third bulk is coupled to the second voltage supply line,
    wherein the first and second sources are commonly coupled to a first voltage supply line, and the first and second bulks are commonly coupled to a second voltage supply line that is different from the first voltage supply line, and
    wherein the first, second and third voltage supply lines are coupled to different voltage suppliers.

2. The transistor array of claim 1, wherein the first, second and third transistors are PMOS transistors.

3. The transistor away of claim 1 wherein the first and second transistors are formed inside a first Nwell which is coupled to the second voltage supply line, and the third transistor is formed inside a second Nwell which is also coupled to the second voltage supply line, wherein the first and second Nwells are separated.

4. A semiconductor cell array having a plurality of identical cells, the cell away comprising:
    a first cell having a first transistor with a first source and a first bulk; and
    a second cell having a second transistor with a second source and a second bulk,
    wherein the first source is coupled to a first voltage supply line, the second source is coupled to a second voltage supply line which is different from and substantially parallel to the first voltage supply line, and the first and second bulks are commonly coupled to a third voltage supply line that is different from the first and second voltage supply lines, and
    wherein different voltages are applied to the first and second voltage supply lines during different operations of the cell array.

5. The cell array of claim 4, wherein the first and second transistors are PMOS transistors.

6. The cell array of claim 4, wherein the first transistor is formed inside a first Nwell, and the second transistor is formed inside a second Nwell separated from the first Nwell, both the first and second Nwells being commonly coupled to the third voltage supply line.

7. The cell array of claim 4 further comprising one or more bit-line conductors, wherein the first and second voltage supply lines are substantially parallel to the bit-line conductors.

8. The cell array of claim 4, wherein the first and second voltage supply lines are formed on a first metal layer, and the third voltage supply line is formed on a second metal layer, and wherein the first or second voltage supply line is substantially perpendicular to the third voltage supply lines.

9. The cell array of claim 4, wherein the cell array forms a core of a static random access memory (SRAM).

10. The cell array of claim 9, wherein voltage level of the first voltage supply lines is higher than voltage level of the third voltage supply line when reading the first cell.

11. The cell array of claim 9, wherein voltage level of the first voltage supply lines is lower than voltage level of the third voltage supply line when writing the first cell.

12. An array of static random access memory (SRAM) cells, comprising:
    a first continuous Nwell column serving as bulks of a plurality of pull-up transistors in a first column of the away of SRAM cells;
    a first voltage supply line coupled to one or more sources of the plurality of pull-up transistors; and
    a second voltage supply line coupled to the first continuous Nwell column, wherein the first and second voltage supply lines are separate, and wherein the first voltage supply line is substantially parallel to the continuous Nwell column.

13. The SRAM cell array of claim 2, wherein the second voltage supply line is substantially perpendicular to the continuous Nwell column.

14. The SRAM cell array of claim 2, wherein the first and second voltage supply lines are in different metal layer, and the first voltage supply line is substantially perpendicular to the second voltage supply line.

15. The cell array of claim 2, wherein voltage level of the first voltage supply line is higher than voltage level of the second voltage supply line during read cycle.

16. The cell array of claim 2, wherein voltage level of the first voltage supply line is lower than voltage level of the second voltage supply line during write cycle.

17. The SRAM cell array of claim 2 further comprising:

a second continuous Nwell column coupled to the second voltage supply line, serving as bulks of a second plurality of pull-up transistors in a second column of the array of SRAM cells;

a third voltage supply line coupled to one or more sources of the second plurality of pull-up transistors; and wherein the first and second continuous Nwell columns are substantially parallel to each other and both are flanked by two continuous P-type columns, and the third voltage supply line is substantially parallel to the first or second continuous Nwell column.

18. The SRAM away of claim 17, wherein the first and third voltage supply lines are connected to different voltage suppliers.

* * * * *